United States Patent
Cook

(10) Patent No.: US 11,293,955 B2
(45) Date of Patent: Apr. 5, 2022

(54) ENERGY METERING FOR A BUILDING

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 715 days.

(21) Appl. No.: 16/214,941

(22) Filed: Dec. 10, 2018

(65) Prior Publication Data

US 2019/0187191 A1 Jun. 20, 2019

Related U.S. Application Data

(60) Provisional application No. 62/598,814, filed on Dec. 14, 2017.

(51) Int. Cl.
| | |
|---|---|
| *G01R 19/25* | (2006.01) |
| *G01R 29/18* | (2006.01) |
| *G01R 17/02* | (2006.01) |
| *G01R 21/133* | (2006.01) |

(52) U.S. Cl.
CPC ......... *G01R 19/2513* (2013.01); *G01R 17/02* (2013.01); *G01R 21/133* (2013.01); *G01R 29/18* (2013.01)

(58) Field of Classification Search
CPC .... G01R 19/2513; G01R 29/18; G01R 17/02; G01R 21/133; G01R 21/002; G01R 21/003; G01R 21/005
USPC .............................. 324/600, 609, 622; 702/64
See application file for complete search history.

(56) References Cited

U.S. PATENT DOCUMENTS

| | | | |
|---|---|---|---|
| 4,096,436 A | 6/1978 | Cook et al. | |
| 4,709,339 A | 11/1987 | Fernandes | |
| 5,086,385 A | 2/1992 | Launey et al. | |
| 5,319,754 A | 6/1994 | Meinecke et al. | |
| 5,384,712 A | 1/1995 | Oravetz et al. | |
| 5,400,246 A | 3/1995 | Wilson et al. | |
| 5,726,644 A | 3/1998 | Jednacz et al. | |
| 5,831,848 A | 11/1998 | Rielly et al. | |
| 5,880,677 A | 3/1999 | Lestician | |
| 5,995,911 A | 11/1999 | Hart | |
| 6,064,192 A | 5/2000 | Redmyer | |
| 6,141,595 A | 10/2000 | Gloudeman et al. | |
| 6,249,241 B1 | 6/2001 | Jordan et al. | |
| 6,330,516 B1 | 12/2001 | Kammeter | |
| 6,353,775 B1 | 3/2002 | Nichols | |
| 6,373,238 B2 | 4/2002 | Lewis et al. | |
| 6,654,750 B1 | 11/2003 | Adams et al. | |
| 6,737,854 B2 | 5/2004 | Bruno et al. | |
| 6,809,509 B2 | 10/2004 | Bruno et al. | |
| 6,825,771 B2 | 11/2004 | Bruno et al. | |
| 6,937,003 B2 | 8/2005 | Bowman et al. | |
| 7,312,964 B2 | 12/2007 | Tchernobrivets | |
| 10,581,123 B2 * | 3/2020 | Hong | H01M 50/543 |
| 10,981,677 B1 * | 4/2021 | Judd | B64G 1/222 |
| 2001/0028646 A1 | 10/2001 | Arts et al. | |

(Continued)

OTHER PUBLICATIONS

European Patent Office, Extended European Search Report for EP App. No. 18212609, dated May 19, 2019, 8 pages.

*Primary Examiner* — Giovanni Astacio-Oquendo

(74) *Attorney, Agent, or Firm* — Chernoff, Vilhauer, McClung & Stenzel, LLP

(57) ABSTRACT

A system for energy metering for a building, such as a data center.

25 Claims, 11 Drawing Sheets

(56) References Cited

U.S. PATENT DOCUMENTS

| | | | |
|---|---|---|---|
| 2003/0023601 A1 | 1/2003 | Fortier, Jr. et al. | |
| 2003/0151513 A1 | 8/2003 | Herrmann et al. | |
| 2010/0207604 A1* | 8/2010 | Bitsch | G01R 21/133 324/140 R |
| 2010/0308792 A1* | 12/2010 | Rupert | G01R 21/133 324/76.77 |
| 2011/0156698 A1* | 6/2011 | Cook | G01R 15/185 324/127 |
| 2014/0184198 A1 | 7/2014 | Cook et al. | |
| 2014/0301238 A1 | 10/2014 | Chun et al. | |
| 2020/0059110 A1* | 2/2020 | Pan | H02J 50/12 |

* cited by examiner

CURRENT TRANSFORMERS OF STRIP

| | | |
|---|---|---|
| 01 |  | |
| 02 |  | LOAD 1 |
| 03 |  | |
| 04 |  | |
| 05 |  | LOAD 2 |
| 06 |  | |
| 07 |  | |
| 08 |  | LOAD 3 |
| 09 |  | |
| 10 |  | |
| 11 |  | LOAD 4 |
| 12 |  | |
| 13 |  | |
| 14 |  | LOAD 5 |
| 15 |  | |
| 16 |  | |
| 17 |  | LOAD 6 |
| 18 |  | |
| 19 |  | |
| 20 |  | LOAD 7 |
| 21 |  | |

CURRENT TRANSFORMERS OF STRIP

| 01 |  | |
| 02 |  | LOAD 1 |
| 03 |  | |
| 04 |  | LOAD 2 |
| 05 |  | |
| 06 |  | LOAD 3 |
| 07 |  | |
| 08 |  | LOAD 4 |
| 09 |  | |
| 10 |  | |
| 11 |  | LOAD 5 |
| 12 |  | |
| 13 |  | LOAD 6 |
| 14 |  | |
| 15 |  | |
| 16 |  | LOAD 7 |
| 17 |  | |
| 18 |  | LOAD 8 |
| 19 |  | |
| 20 |  | LOAD 9 |
| 21 |  | LOAD 10 |

ENERGY METERING FOR A BUILDING

CROSS-REFERENCE TO RELATED APPLICATIONS

This application claims the benefit of U.S. Provisional App. No. 62/598,814, filed Dec. 14, 2017.

BACKGROUND OF THE INVENTION

The present invention relates to an energy metering system for a building, such as a data center.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

DETAILED DESCRIPTION OF PREFERRED EMBODIMENTS

Figure 1:
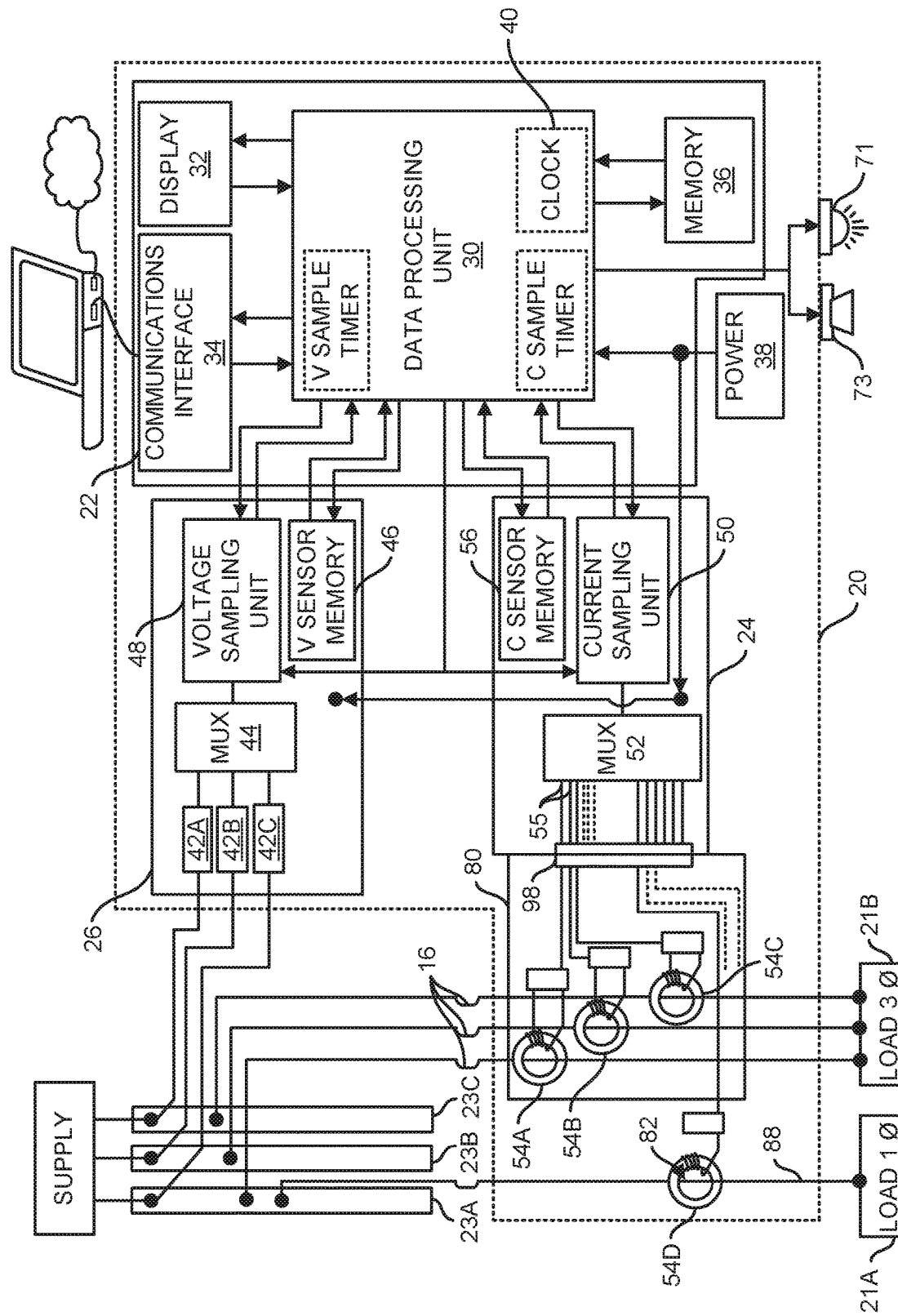
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
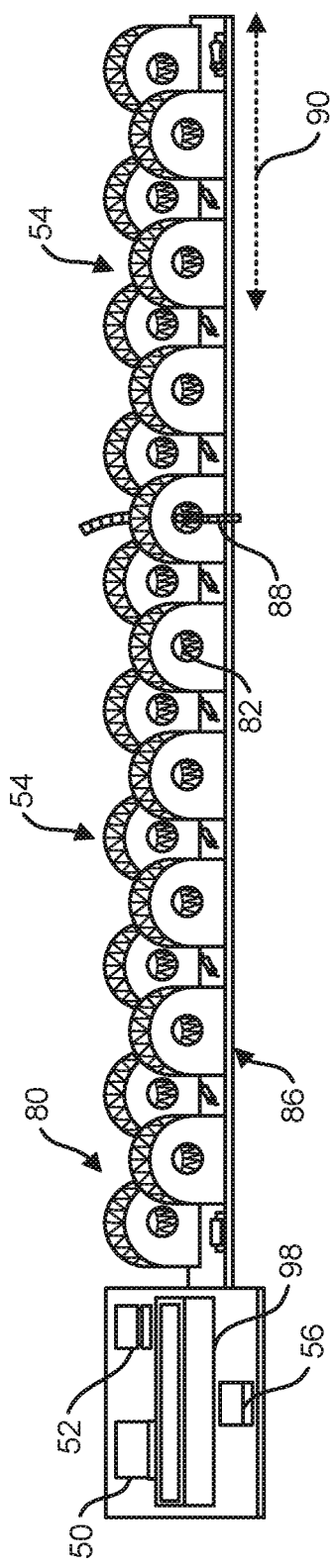
FIG. 2 is a perspective view of a current transformer strip for a branch current monitor.
Figure 3:
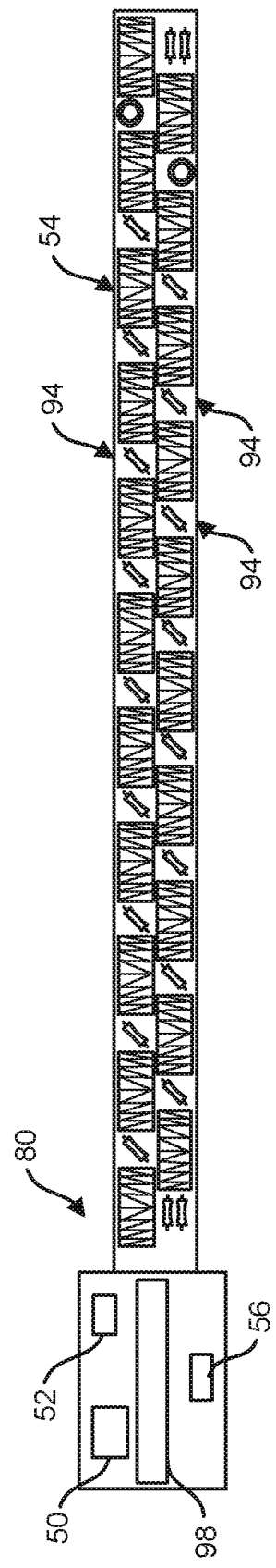
FIG. 3 is a top view of the current transformer strip of FIG. 2.
Figure 4:
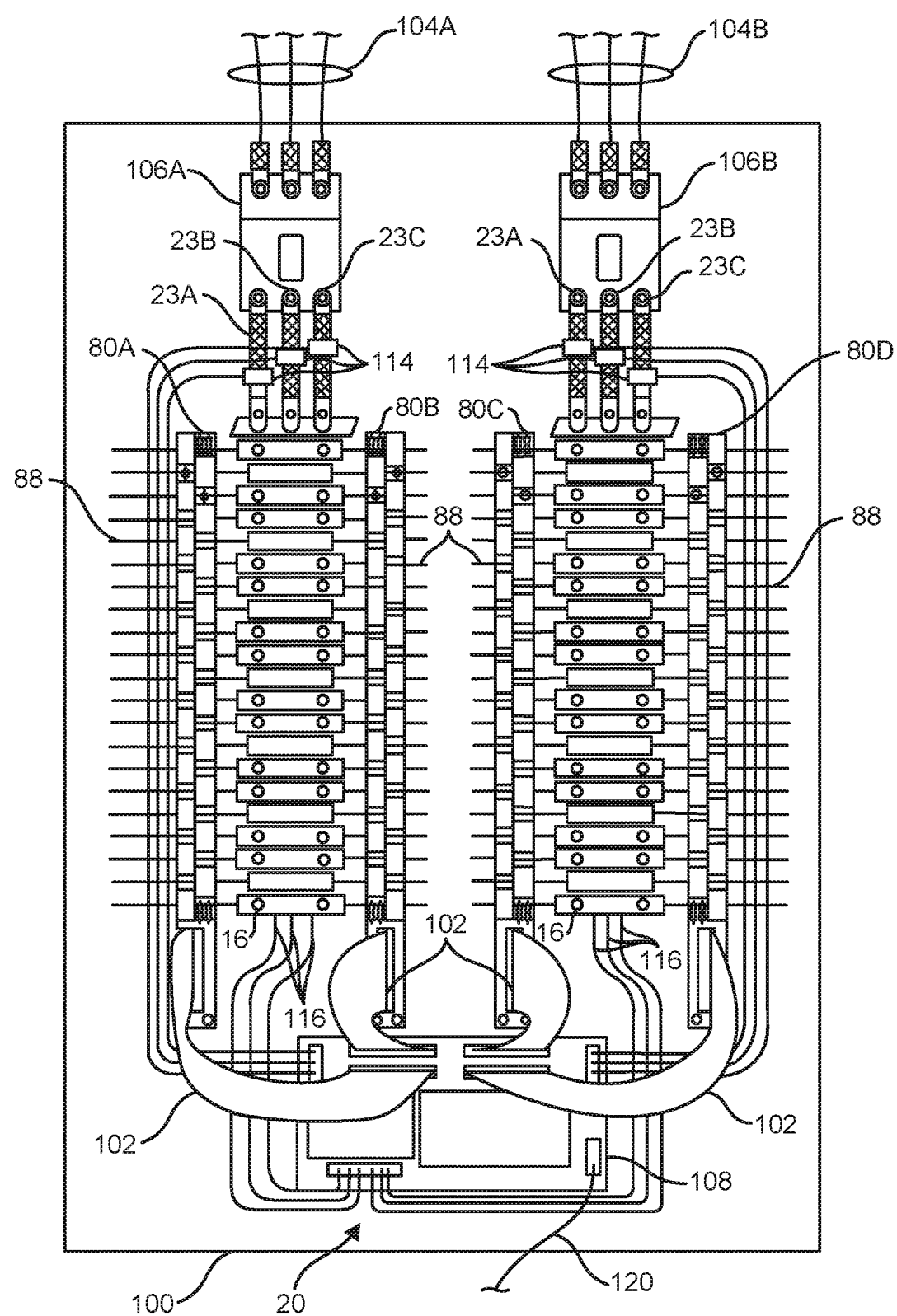
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
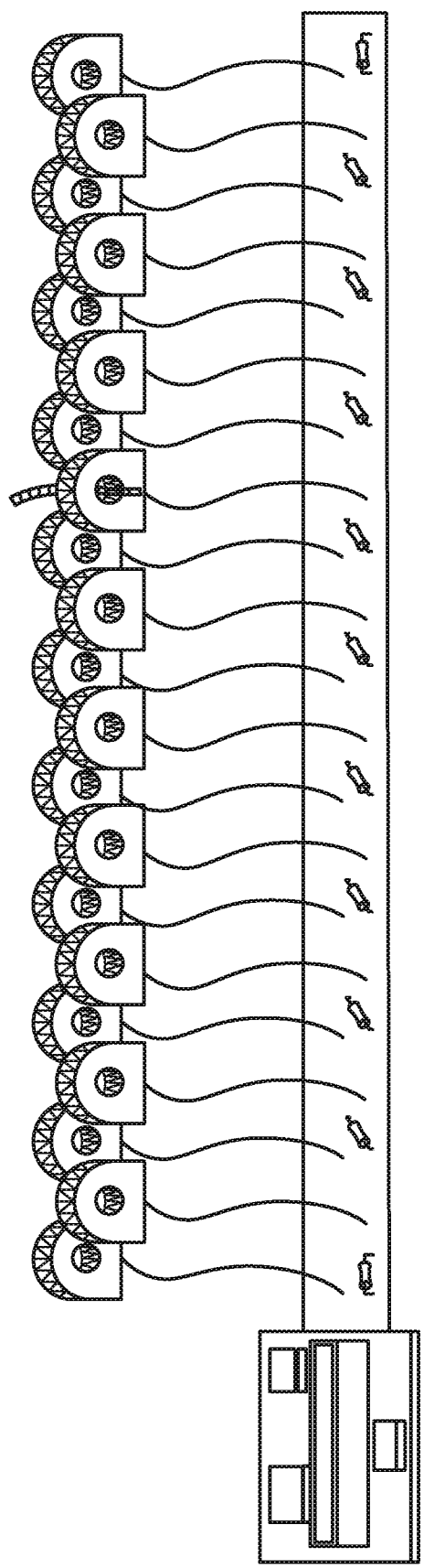
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
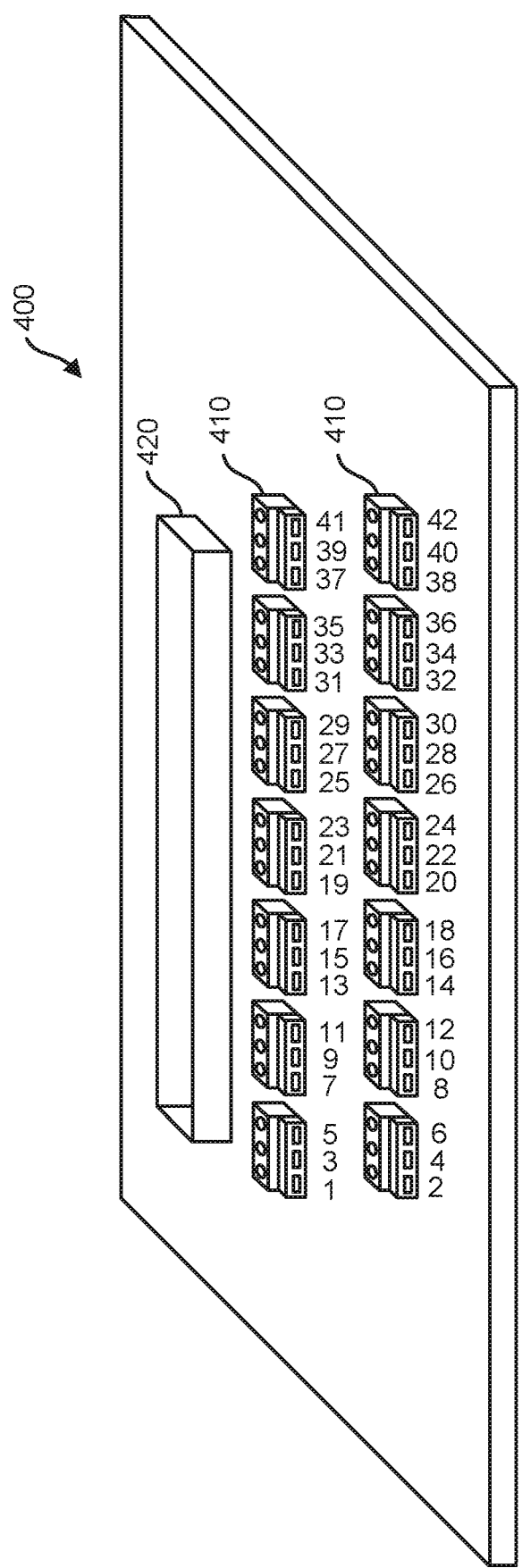
FIG. 6 illustrates a view of a connector board for a branch current monitor with a temperature sensor.

Referring to FIG. 6, another embodiment includes a set of one or more connector boards 400 in addition to or as an alternative to the strip units. Each of the connector boards may include a set of connectors 410 that may be used to interconnect a current transformer thereto. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

It is to be understood that the current sensor may be any suitable technique, including non-toroidal cores.

Referring again to FIG. 2 though FIG. 6, the installer of the system may misconnect one or more of the bus bars 23A, 23B, and/or 23C to the main acquisition board and accordingly the voltages would most likely be improperly aligned with the current being provided by the corresponding power conductor. For example, phases A (23A) and B (23B) may be reversed on the connection on one side of the panel (e.g., left side) while being properly connected on the other side of the panel (e.g., right side) to the main acquisition board. Typically, the main acquisition board which should associate a selected set of power conductors with phase A will actually be associating the selected set of power conductors to phase B, and the main acquisition board which should associate a selected set of power conductors with phase B will actually be associating the selected set of power conductors to phase A. This will result in improper power calculations by the main acquisition board and other electrical characteristics.

Referring again to FIG. 2 though FIG. 6, the installer of the system may misconnect one or more of the power conductors through the current transformer to the associated circuit breaker and thus improperly align one or more power conductors with the corresponding circuit breaker. For example, power conductors may be reversed on the connection to the corresponding circuit breaker, which also change relationships the phase relationships of a multi-phase connection. Typically, the main acquisition board which should associate one or more power conductors with phase A will actually be associating the one or more power conductors with phase B, and the main acquisition board which should associate one or more of power conductors with phase B will actually be associating the one or more power conductors to phase A. This will result in improper power calculations by the main acquisition board and other electrical characteristics, in addition to improper association of the current measurements with the associated load in the case that the power conductors are interconnected to different loads.

Referring again to FIG. 2 though FIG. 6, the installer of the power panel may misconnect one or more of the circuit breakers to a different bus bar than anticipated thus improperly align the power conductor with the corresponding bus bar. For example, circuit breaker 16A may be reversed from the anticipated connection to bus bar 23A to a connection to bus bar 23B, and circuit breaker 16B may be reversed from the anticipated connection to bus bar 23B to a connection to bus bar 23A, which changes the phases of a multi-phase connection. Typically, the main acquisition board which should associate one or more circuit breakers with phase A will actually be associating the one or more power conductors to phase B, and the main acquisition board which should associate one or more of circuit breakers with phase B will actually be associating the one or more power conductors to phase A. This will result in improper power calculations by the main acquisition board and other electrical characteristics, in addition to improper association of the current measurements with the associated load in the case that the power conductors are interconnected to different loads.

Referring again to FIG. 2 though FIG. 6, the installer of the power panel may program configuration data into within the main acquisition board (or otherwise programmed into an interconnected network device) that aligns particular power conductors and their associated sensed current levels sensed by particular current transformers, with particular bus bars may include errors, thus improperly align the power conductors with the corresponding bus bars and/or sensed current levels. The configuration data may be incorrect and result in errors in the data calculations.

As it may be observed, there are many sources of potential errors when configuring a branch current metering system which are problematic to identify and rectify. Furthermore, these problems persist in many different configurations, such as those embodiments illustrated in FIG. 2 through FIG. 6.

In many instances, the phase alignment between the voltage sensor for a bus bar and the current sensor sensing the changing current for a load are correlated together with one another. With the phase alignment being correlated together between the voltage(s) and current(s), and each of the bus bars being related to a particular phase of a single phase, a two phase, and/or a three phase circuit, the corresponding current sensors are likewise then associated with phase A, phase B, and/or Phase C of a corresponding load. Such measurements may be used to configure the metering system and/or used to verify the configuration of the metering system. In situations where the power factor between the current and voltage waveforms differs significantly, the corresponding voltages and current phases for A, B, and C are not necessarily those that are closet to one another making confirmation that the phases of the currents and voltages are properly aligned with one another more problematic. Unfortunately, such alignment techniques for configuring and/or verifying the phases associated with the loads are not feasible in some building environments, including for example a data center environment, because the voltages to the loads are not readily available for interconnection therewith. Upon further consideration it was determined that the power factor between the corresponding currents and voltage are typically around 0.9 which means that the phases between the voltage and current waveforms are substantially aligned with one another. In such an environment, it was determined that a metering system can presume that the corresponding voltage alignment (power factor) and the magnitude of the voltage waveforms are generally known due to the controlled nature of the environment. Accordingly, the corresponding voltage and current waveforms of a multi-phase load are generally 120 degrees out of phase with one another (for a three phase load), and the corresponding voltage and current waveforms for the same and for different loads are likewise generally aligned with another.

Figure 7:
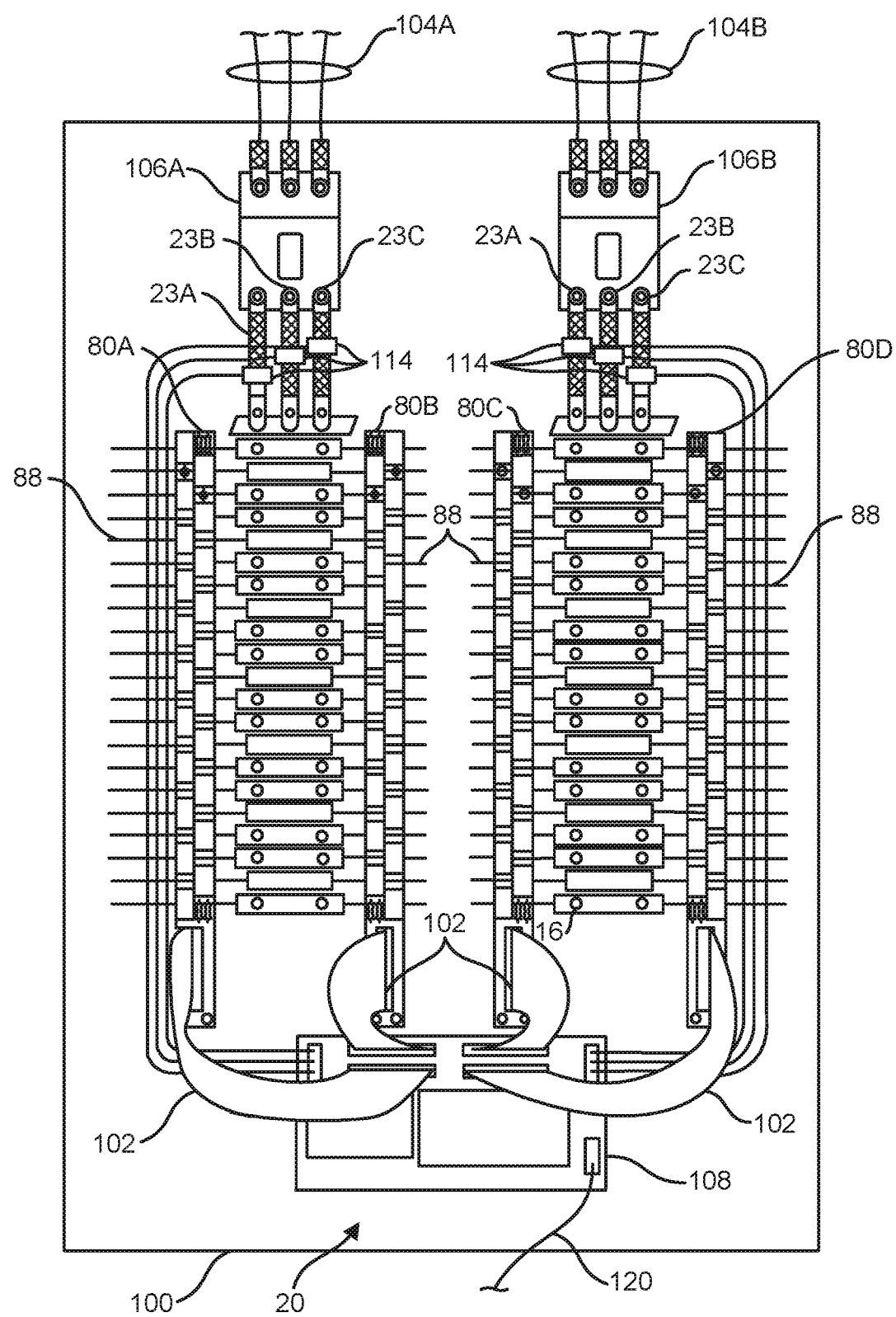
FIG. 7 illustrates a front view of an exemplary electrical distribution panel and branch current monitor without voltage connections.

Referring to FIG. 7, a modified energy monitor system suitable for some building environments, including for example a data center environment, may omit the connections to the voltages for the corresponding phases of a multi-phase system. In this manner, the system will only sense the currents from the power conductors and not the voltages of the corresponding phases of the multi-phase system. The system may estimate the current to the loads based upon the data from the current sensors. The system may estimate the power based upon a nominal voltage value and power factor, if appropriate.

Figure 8:
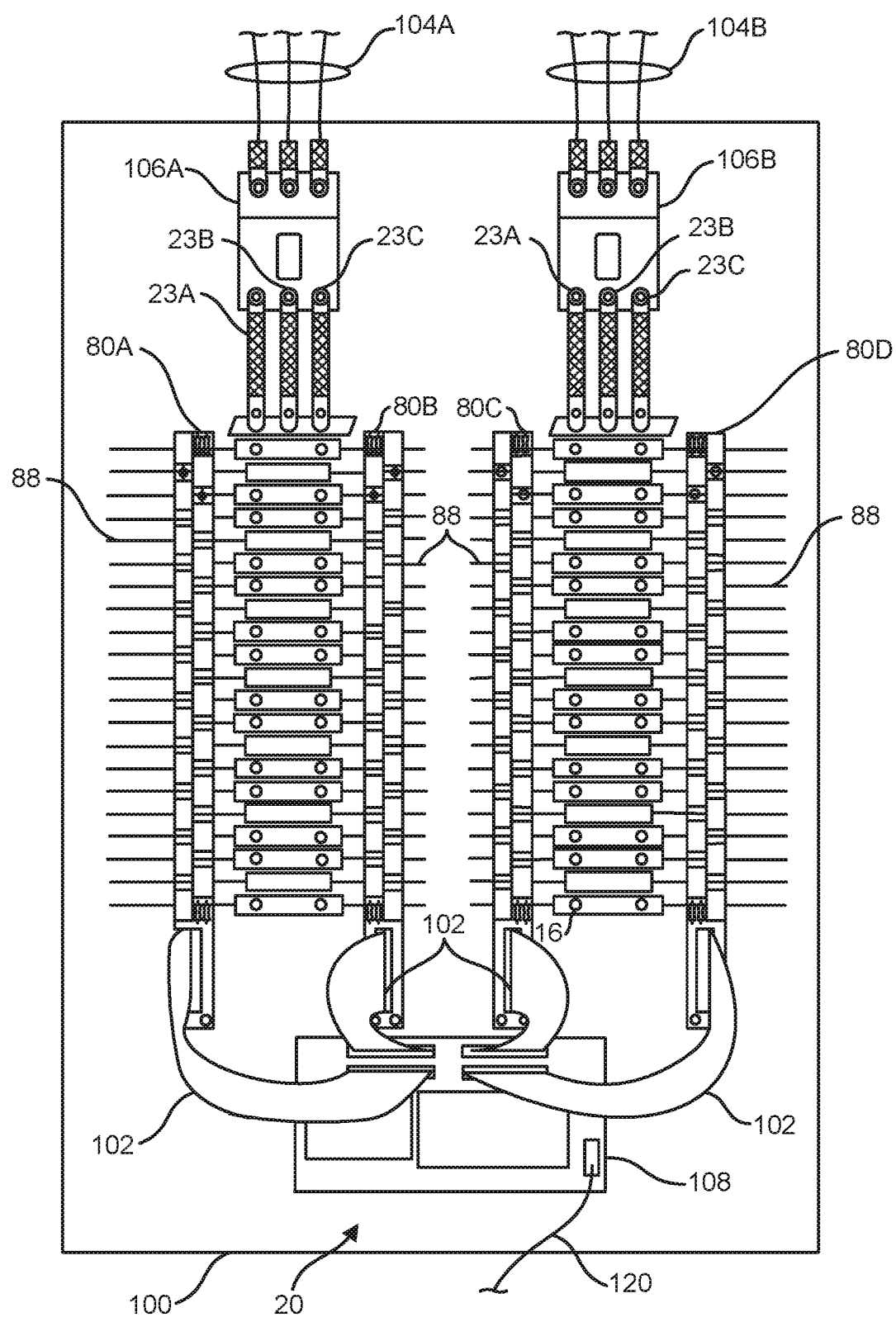
FIG. 8 illustrates a front view of an exemplary electrical distribution panel and branch current monitor without voltage connections and without voltage conductor current sensors.

Referring to FIG. 8, in addition, preferably the energy monitor system omits the connections of the current sensors 114 that are interconnected with the mains, since the mains are typically not readily accessible in some building environments, including for example a data center environment. The system may estimate the current to the loads based upon the data from the current sensors. The system may estimate the power based upon a nominal voltage value and power factor, if appropriate.

Figure 9:
FIG. 9 illustrates a set of current sensor measurements and associated loads.
Figure 9:
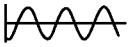
Figure 9:
Figure 9:
Figure 9:
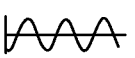
Figure 9:
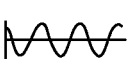
Figure 9:
Figure 9:
Figure 9:
Figure 9:
Figure 9:
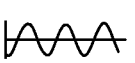
Figure 9:
Figure 9:
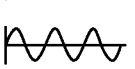
Figure 9:
Figure 9:
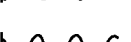
Figure 9:
Figure 9:
Figure 9:
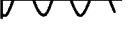
Figure 9:
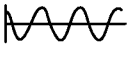
Figure 9:
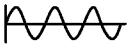
Figure 9:
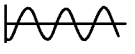

Referring to FIG. 9, the energy monitor system may sense all or a part of the current waveforms from each of the current transformers for each of the strips. By way of example, for each of the current transformers (e.g., 21 current transformers) characteristics of the voltage waveform may be determined, such as its minimum, maximum, zero crossing, rising zero crossing, falling zero crossing, the timing of a characteristic, or otherwise. The characteristics determined from the current transformers (e.g., minimum, maximum, zero crossing, rising zero crossing, falling zero crossing, the timing of a characteristic, or otherwise) may be compared to one another to determine which of the current transformers are likely properly associated with which phase of a single phase, a two phase, and/or a three phase circuit. For example, current transformers 01, 04, 07, 10, 13, 16, and 19 may be associated with phase A. For example, current transformers 02, 05, 08, 11, 14, 17, and 20 may be associated with phase B. For example, current transformers 03, 06, 09, 12, 15, 18, and 21 may be associated with phase C.

With each of the current transformers associated with a particular phase, the current transformers may be grouped with respective single phase, two phase, and/or three phase circuits. Typically, adjacent current transformers with different phases are associated with the same load. In this manner, current transformers 01, 02, 03 may be associated with load 1, current transformers 04, 05, 06 may be associated with load 2, current transformers 07, 08, 09 may be associated with load 3, current transformers 10, 11, 12 may be associated with load 4, current transformers 13, 14, 15 may be associated with load 5, current transformers 16, 17, 18 may be associated with load 6, current transformers 19, 20, 21 may be associated with load 7. The result of such a phase determination and grouping may result in a set of data indicating a mapping between the current transformers, the respective phases, and the respective loads. This mapping may be compared against the mapping of the current transformers, phases, grouping of phases for particular loads, programmed into the energy metering system. If the mappings are consistent with one another, then the system may indicate no discrepancies were determined. If the mappings are not consistent with one another, then the system may indicate there are discrepancies, the system may indicate the nature of the discrepancies, and/or the system may modify the mapping of the energy metering system to be consistent with the mapping determined from the current transformers. In addition, the mapping determined from the current transformers may be used to program the energy metering system.

Figure 10:
FIG. 10 illustrates another set of current sensor measurements and associated loads.
Figure 10:
Figure 10:
Figure 10:
Figure 10:
Figure 10:
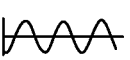
Figure 10:
Figure 10:
Figure 10:
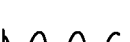
Figure 10:
Figure 10:
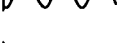
Figure 10:
Figure 10:
Figure 10:
Figure 10:
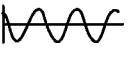
Figure 10:
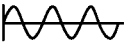
Figure 10:
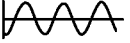
Figure 10:
Figure 10:
Figure 10:
Figure 10:

Referring to FIG. 10, the energy monitor system may sense all or a part of the current waveforms from each of the current transformers for each of the strips. By way of example, for each of the current transformers (e.g., 21 current transformers) characteristics of the voltage waveform may be determined, such as its minimum, maximum, zero crossing, rising zero crossing, falling zero crossing, the timing of a characteristic, or otherwise. The characteristics determined from the current transformers (e.g., minimum, maximum, zero crossing, rising zero crossing, falling zero crossing, the timing of a characteristic, or otherwise) may be compared to one another to determine which of the current transformers are likely properly associated with which phase of a single phase, a two phase, and/or a three phase circuit. For example, current transformers 01, 04, 05, 07, 12, 15, 17, 20, and 21 may be associated with phase A. For example, current transformers 02, 06, 08, 10, 13, 16, and 18 may be associated with phase B. For example, current transformers 03, 09, 11, 14, ad 19 may be associated with phase C.

With each of the current transformers associated with a particular phase, the current transformers may be grouped with respective single phase, two phase, and/or three phase circuits. Typically, adjacent current transformers with different phases are associated with the same load. In this manner, current transformers 01, 02, 03 may be associated with load 1, current transformer 04 may be associated with load 2, current transformers 05, 06 may be associated with load 3, current transformers 07, 08, 09 may be associated with load 4, current transformers 10, 11 may be associated with load 5, current transformers 12, 13, 14 may be associated with load 6, current transformers 15, 16 may be associated with load 7, current transformers 17, 18, 19 may be associated with load 8, current transformer 20 may be associated with load 9, current transformer 21 may be associated with load 10. The result of such a phase determination and grouping may result in a set of data indicating a mapping between the current transformers, the respective phases, and the respective loads. This mapping may be compared against the mapping of the current transformers, phases, grouping of phases for particular loads, programmed into the energy metering system. If the mappings are consistent with one another, then the system may indicate no discrepancies were determined. If the mappings are not consistent with one another, then the system may indicate there are discrepancies, the system may indicate the nature of the discrepancies, and/or the system may modify the mapping of the energy metering system to be consistent with the mapping determined from the current transformers. In addition, the mapping determined from the current transformers may be used to program the energy metering system.

Figure 11:
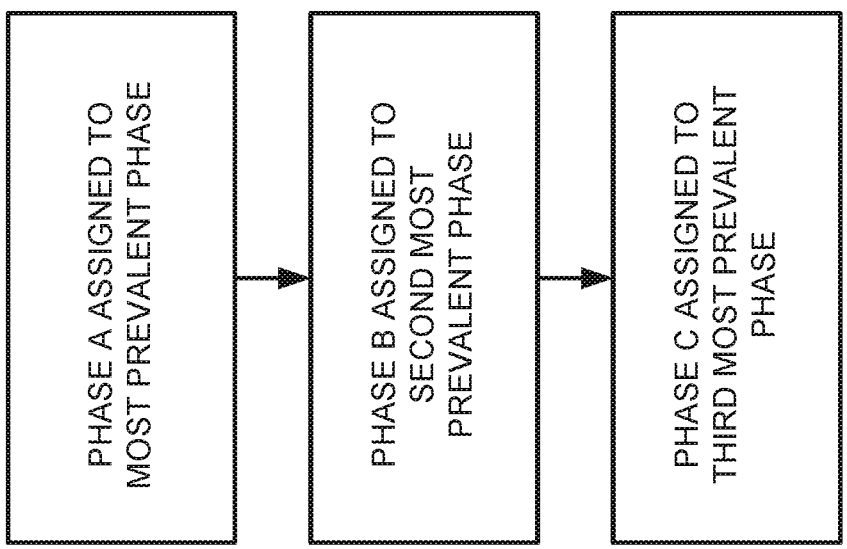
FIG. 11 illustrates a phase assignment technique.

Referring to FIG. 11, by way of example, the phase A may be assigned to the phase that is the most prevalent for the current sensors, Phase B may be assigned to the phase that is the second most prevalent for the current sensors, and Phase C may be assigned to the phase that is the third most prevalent for the current sensors. In the case that two sets of phases are the same prevalence, the earlier of phase A, B, and C may be assigned based upon anticipated position of that phase (e.g., phase A for top current transformer, phase B for second top current transformer, phase C for third top current transformer). Other assignment techniques for phase A, B, and C may be used, such as based upon the spatial arrangement of phase groupings, such as groups of different phases in a vertical alignment adjacent one another.

Figure 12:
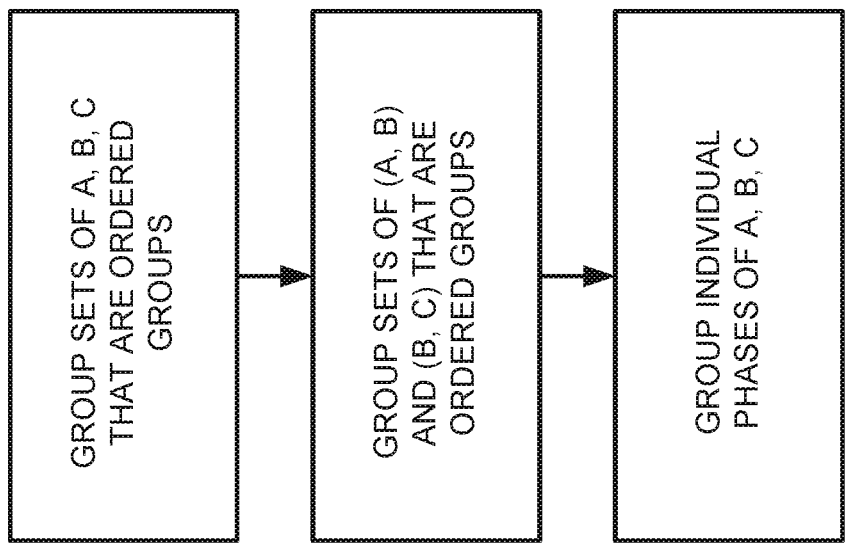
FIG. 12 illustrates another phase assignment technique.

Referring to FIG. 12, by way of example, the system may group sets of phases A, B, C which are in an ordered group vertically (e.g., current transformer 01 having phase A, current transformer 02 having phase B, current transformer 03 having phase C) as being associated with a respective three phase load. The system may then group sets of phases A, B and B C which are in an ordered group vertically (e.g., current transformer 01 having phase A, current transformer 02 having phase B, or current transformer 01 having phase B, current transformer 02 having phase C) as being associated with a respective two phase load. The system may then group individual phases of phase A, B, and C as being associated with a respective single phase load.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A current monitoring system comprising:
   (a) a board that includes a first connector;
   (b) a first support including a plurality of current sensors interconnected to said first support suitable to sense changing current of a respective conductor to a load;
   (c) a first cable electrically interconnecting said first connector and said plurality of current sensors;
   (d) said first connector suitable for receiving sensor data from said first cable representative of current levels of said respective conductors of said plurality of current sensors;
   (e) a processor interconnected with said first connector associating a plurality of said current levels with phase A based upon similarities of said plurality of said current levels;
   (f) said processor interconnected with said first connector associating another plurality of said current levels with phase B based upon similarities of said plurality of said current levels;
   (g) said processor interconnected with said first connector associating yet another plurality of said current levels with phase C based upon similarities of said plurality of said current levels, where said current levels associated with said phase A, said phase B, and said phase C are all associated with only one of said phase A, said phase B, and said phase C.

2. The current monitoring system of claim 1 is free from being directly sensing a voltage associated with said respective conductors to said load.

3. The current monitoring system of claim 2 is free from being directly sensing a current level of a main conductor that provides current to each of a plurality of said current sensors.

4. The current monitoring system of claim 1 is free from being directly sensing a current level of a main conductor that provides current to each of a plurality of said current sensors.

5. The current monitoring system of claim 1 wherein a set of three current sensors are grouped together for a particular load based upon said association with said phase A, said phase B, and said phase C.

6. The current monitoring system of claim 5 wherein said set of three current sensors are further based upon a proximity to one another.

7. The current monitoring system of claim 1 wherein a plurality of sets of three current sensors are grouped together for a respective particular loads based upon said association with said phase A, said phase B, and said phase C.

8. The current monitoring system of claim 7 wherein each of said plurality of sets associated with said respective particular load are compared against a mapping of said current monitoring system to determine if they are consistent.

9. The current monitoring system of claim 8 wherein any inconsistencies in comparison against said mapping are identified.

10. The current monitoring system of claim 8 wherein said mapping is modified based upon said comparing.

11. The current monitoring system of claim 1 wherein said phase A is assigned based upon the most prevalent of said plurality of current sensors.

12. The current monitoring system of claim 11 wherein said phase B is assigned based upon the next most prevalent of said plurality of current sensors.

13. The current monitoring system of claim 12 wherein said phase C is assigned based upon the least prevalent of said plurality of current sensors.

14. The current monitoring system of claim 1 wherein a set of three current sensors are grouped together for a particular load based upon said association with said phase A, said phase B, and said phase C and their ordered arrangement with respect to one another.

15. A method for monitoring current by a current monitoring system comprising the steps of:
   (a) said current monitoring system receiving sensor data representative of current levels from a plurality of current sensors interconnected to a first support suitable to sense changing current of a respective conductor to a load;
   (b) said current monitoring system associating a plurality of said current levels with phase A based upon similarities of said plurality of said current levels without regard to sensing a voltage level of any of said respective conductors to said load;
   (c) said current monitoring system associating another plurality of said current levels with phase B based upon similarities of said plurality of said current levels without regard to sensing said voltage level of any of said respective conductors to said load;
   (d) said current monitoring system associating yet another plurality of said current levels with phase C based upon similarities of said plurality of said current levels without regard to sensing said voltage level of any of said respective conductors to said load, where said current levels associated with said phase A, said phase B, and said phase C are all associated with only one of said phase A, said phase B, and said phase C.

16. The method for monitoring current of claim 15 is free from directly sensing a voltage associated with said respective conductors to said load.

17. The method for monitoring current of claim 16 is free from being directly sensing a current level of a main conductor that provides current to each of a plurality of said current sensors.

18. The method for monitoring current of claim 15 is free from being directly sensing a current level of a main conductor that provides current to each of a plurality of said current sensors.

19. The method for monitoring current of claim 15 wherein a set of three current sensors are grouped together for a particular load based upon said association with said phase A, said phase B, and said phase C.

20. The method for monitoring current of claim 19 wherein said set of three current sensors are further based upon a proximity to one another.

21. The method for monitoring current of claim 15 wherein a plurality of sets of three current sensors are grouped together for a respective particular loads based upon said association with said phase A, said phase B, and said phase C.

22. The method for monitoring current of claim 15 wherein said phase A is assigned based upon the most prevalent of said plurality of current sensors.

23. The method for monitoring current of claim 22 wherein said phase B is assigned based upon the next most prevalent of said plurality of current sensors.

24. The method for monitoring current of claim 23 wherein said phase B is assigned based upon the least prevalent of said plurality of current sensors.

25. The method for monitoring current of claim 15 wherein a set of three current sensors are grouped together for a particular load based upon said association with said phase A, said phase B, and said phase C and their ordered arrangement with respect to one another.

* * * * *